United States Patent
Takeyama et al.

(10) Patent No.: US 11,581,690 B2
(45) Date of Patent: Feb. 14, 2023

(54) ROBOT APPARATUS FOR PRODUCING ELECTRONIC APPARATUS

(71) Applicant: SONY CORPORATION, Tokyo (JP)

(72) Inventors: Shinichi Takeyama, Chiba (JP); Hirokuni Beppu, Chiba (JP)

(73) Assignee: SONY CORPORATION, Tokyo (JP)

(*) Notice: Subject to any disclaimer, the term of this patent is extended or adjusted under 35 U.S.C. 154(b) by 458 days.

(21) Appl. No.: 16/609,821

(22) PCT Filed: Apr. 13, 2018

(86) PCT No.: PCT/JP2018/015518
§ 371 (c)(1),
(2) Date: Oct. 31, 2019

(87) PCT Pub. No.: WO2018/207552
PCT Pub. Date: Nov. 15, 2018

(65) Prior Publication Data
US 2020/0067255 A1 Feb. 27, 2020

(30) Foreign Application Priority Data
May 9, 2017 (JP) .............................. JP2017-092947

(51) Int. Cl.
*H01R 43/26* (2006.01)
*B25J 11/00* (2006.01)
(Continued)

(52) U.S. Cl.
CPC ............ *H01R 43/26* (2013.01); *B25J 11/005* (2013.01); *B25J 15/08* (2013.01); *H01R 12/79* (2013.01)

(58) Field of Classification Search
CPC ......... B25J 11/005; B25J 15/08; H01R 12/79; H01R 43/26
See application file for complete search history.

(56) References Cited

U.S. PATENT DOCUMENTS 3,997,956 A    12/1976   McKee
4,367,891 A *  1/1983    Wauer ................... B25J 15/106
                                                      294/902
(Continued)

FOREIGN PATENT DOCUMENTS

CN    104044146 A    9/2014
CN    104942804 A    9/2015
(Continued)

OTHER PUBLICATIONS

International Search Report and Written Opinion of PCT Application No. PCT/JP2018/015518, dated Jul. 17, 2018, 09 pages of ISRWO.

*Primary Examiner* — Carl J Arbes
(74) *Attorney, Agent, or Firm* — Chip Law Group

(57) ABSTRACT

A robot apparatus includes a clamp mechanism; a transport mechanism; and a control unit. The clamp mechanism includes a first finger that has a first support surface and a housing portion and a second finger. The first support surface supports an aligned wire group that includes a plurality of wires, the housing portion includes a guide wall that is connected to the first support surface and regulates an amount of movement of the band member in a width direction. The second finger has a second support surface facing the first support surface and a facing portion being connected to the second support surface and facing the housing portion. The transport mechanism is capable of moving the clamp mechanism. The control unit controls a grip force of the clamp mechanism and a direction of movement of the clamp mechanism by the transport mechanism.

6 Claims, 7 Drawing Sheets

(51) Int. Cl.
    *B25J 15/08*     (2006.01)
    *H01R 12/79*     (2011.01)

(56) References Cited

U.S. PATENT DOCUMENTS

| | | | |
|---|---|---|---|
| 4,740,126 A * | 4/1988 | Richter | B25J 15/0009 623/64 |
| 5,501,498 A * | 3/1996 | Ulrich | B25J 13/084 294/111 |
| 6,517,132 B2 * | 2/2003 | Matsuda | B25J 15/08 901/38 |
| 2004/0266276 A1 | 12/2004 | Hariki et al. | |
| 2010/0207412 A1 | 8/2010 | Okazaki | |
| 2010/0256818 A1 | 10/2010 | Aoba | |
| 2014/0277732 A1 | 9/2014 | Shiota et al. | |
| 2016/0221188 A1 | 8/2016 | Nagai | |
| 2017/0368651 A1 * | 12/2017 | Lang | B25B 1/103 |

FOREIGN PATENT DOCUMENTS

| | | |
|---|---|---|
| EP | 1054439 A1 | 11/2000 |
| EP | 1488893 A2 | 12/2004 |
| EP | 2783802 A2 | 10/2014 |
| JP | 2005-011580 A | 1/2005 |
| JP | 2013-022672 A | 2/2013 |
| JP | 2014-176917 A | 9/2014 |
| JP | 2015-030086 A | 2/2015 |
| WO | 2004/028753 A3 * | 4/2004 |
| WO | 2017/046975 A1 | 3/2017 |

* cited by examiner

ROBOT APPARATUS FOR PRODUCING ELECTRONIC APPARATUS

CROSS REFERENCE TO RELATED APPLICATIONS

This application is a U.S. National Phase of International Patent Application No. PCT/JP2018/015518 filed on Apr. 13, 2018, which claims priority benefit of Japanese Patent Application No. JP 2017-092947 filed in the Japan Patent Office on May 9, 2017. Each of the above-referenced applications is hereby incorporated herein by reference in its entirety.

TECHNICAL FIELD

The present technology relates to, for example, a robot apparatus used for producing an electronic apparatus that includes a harness including a plurality of wires and a terminal unit connected to an end thereof, and a flexible band member such as FFC (Flexible Flat Cable) and FPC (Flexible Printed Circuit), and to a method of producing the electronic apparatus.

BACKGROUND ART

For example, industrial robots are widely used for the assembly of electronic parts in the production of electronic apparatuses. For example, there is known a technology for automatically performing a step of connecting a linear member such as a cable and a connector part (see, for example, Patent Literature 1).

CITATION LIST

Patent Literature

Patent Literature 1: Japanese Patent Application Laid-open No. 2014-176917

DISCLOSURE OF INVENTION

Technical Problem

Since a wire group such as a harness has flexibility, the initial position of the terminal unit at the tip differs for each workpiece. Thus, it has been difficult for a robot to grip the terminal unit of the harness or the vicinity thereof with high accuracy.

In view of the circumstances as described above, it is an object of the present invention to provide a robot apparatus capable of gripping a tip of a wire group such as a harness, and a method of producing an electronic apparatus.

Solution to Problem

A robot apparatus according to the present technology includes: a clamp mechanism; a transport mechanism; and a control unit.

The clamp mechanism includes a first finger and a second finger.

The first finger has a first support surface and a housing portion, the first support surface being capable of supporting a wire group while the wire group is aligned, the wire group including a plurality of wires, one end of the wire group being fixed, the other end of the wire group including a terminal unit connectable to a connection portion, the housing portion including a guide wall that is connected to the first support surface and regulates an amount of movement of the wire group in an alignment direction.

The second finger has a second support surface and a facing portion, the second support surface facing the first support surface, the facing portion being connected to the second support surface and facing the housing portion, the second finger being configured to be movable relative to the first finger.

The transport mechanism is configured to be capable of moving the clamp mechanism.

The control unit controls a grip force of the clamp mechanism for gripping the wire group and a direction of movement of the clamp mechanism by the transport mechanism.

The robot apparatus clamps the wire group at an arbitrary position by the first and second support surfaces, aligns the wire group, and guides the wire group to the housing portion while moving the clamp mechanism in the state in which the grip force is adjusted such that the wire group is slidable relative to the support surfaces. Since the guide wall is provided in the housing portion, the movement of the wire group guided to the housing portion in the alignment direction is regulated. In this state, the clamp mechanism is moved toward the tip of the wire group. As a result, it is possible to grip the tip of the wire group with high accuracy.

The clamp mechanism may include a drive unit and a force sensor. The drive unit is configured to be capable of relatively moving the second finger relative to the first finger. The force sensor is configured to be capable of detecting an external force acting on the first finger.

As a result, since the arrival of the wire group to the housing portion can be detected with high accuracy, it is possible to prevent an excessive load from being applied to the wire group.

The control unit is configured to execute, for example, first movement control for moving the clamp mechanism in a direction in which the wire group slides toward the housing portion between the first support surface and the second support surface.

The control unit may be further configured to execute second movement control for moving the clamp mechanism toward an upper side of the one end after the first movement control.

As a result, it is possible to grip the tip of the wire group with high accuracy.

The housing portion may be provided at a tip of the first finger.

The robot apparatus may further include a camera capable of imaging the wire group in the housing portion.

A method of producing an electronic apparatus according to an embodiment of the present technology is a method of producing an electronic apparatus that includes a base substrate and a wire group, the base substrate including a connection portion, the wire group including a plurality of wires, one end of the wire group being fixed to the base substrate, the other end of the wire group including a terminal unit to be connected to the connection portion, the method including: clamping the wire group between first and second fingers of a clamp mechanism.

The clamp mechanism is moved in a direction in which the wire group between the first and second fingers slides toward the housing portion.

The clamp mechanism is moved toward the terminal unit while regulating an amount of movement of the wire group in an alignment direction by a guide wall portion in the housing portion.

The terminal unit or a vicinity thereof is gripped by the first and second fingers.

The method of producing an electronic apparatus may further include connecting the terminal unit to the connection portion by moving the clamp mechanism to the connection portion.

The wire group may be a harness, an FPC (flexible printed circuit), or an FFC (flexible flat cable).

Advantageous Effects of Invention

As described above, in accordance with the present technology, it is possible to grip a tip of a wire group with high accuracy.

It should be noted that the effect described here is not necessarily limitative and may be any effect described in the present disclosure.

MODE(S) FOR CARRYING OUT THE INVENTION

Hereinafter, an embodiment of the present technology will be described with reference to the drawings.

Figure 1:
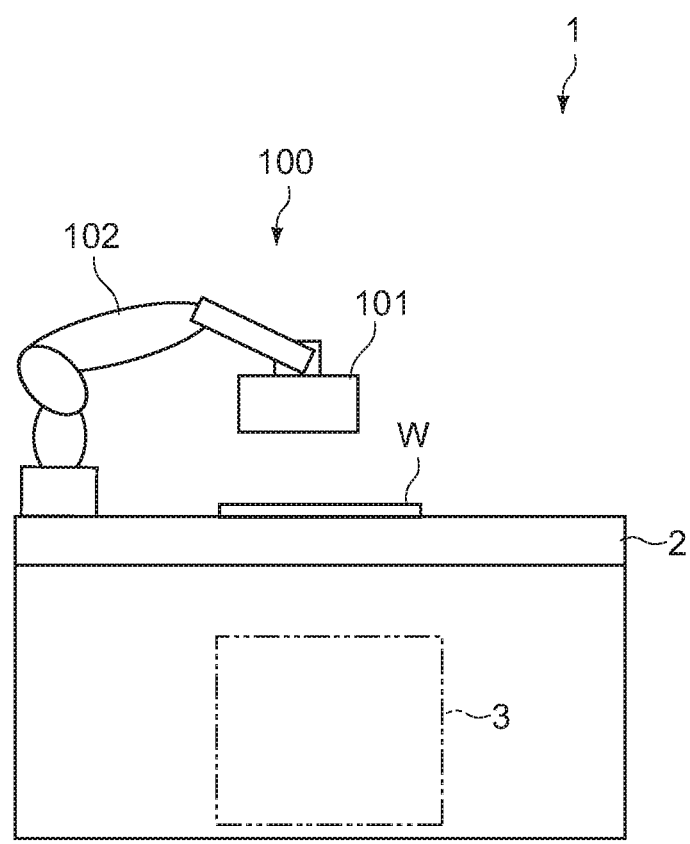
FIG. 1 is a schematic side view showing a production apparatus (robot apparatus) of an electronic apparatus according to an embodiment of the present technology.

FIG. 1 is a schematic side view showing a production apparatus (robot apparatus) of an electronic apparatus according to an embodiment of the present technology. In this embodiment, an application example of the present technology to a step of automatically connecting a band-shaped cable member, which is one step of producing an electronic apparatus, will be described.

[Schematic Configuration of Robot Apparatus]

A robot apparatus 1 according to this embodiment includes an assembly robot 100, a work bench 2 that supports a semi-finished product (hereinafter, referred to also as workpiece W) of an electronic apparatus, and a controller 3 (control unit) that controls driving of the assembly robot 100.

The assembly robot 100 includes a hand unit 101 and an articulated arm 102 capable of moving the hand unit 101 to an arbitrary coordinate position with six-axis degrees of freedom.

The articulated arm 102 is connected to the work bench 2 or a drive source (not shown) disposed closed to the work bench 2. The articulated arm 102 is configured as a transport mechanism that converts the movement and posture of the hand unit 101.

The controller 3 typically includes a computer including a CPU (Central Processing Unit) and a memory, and is configured to control driving of the assembly robot 100 in accordance with the program stored in the memory.

[Assembly Robot]

Figure 2:
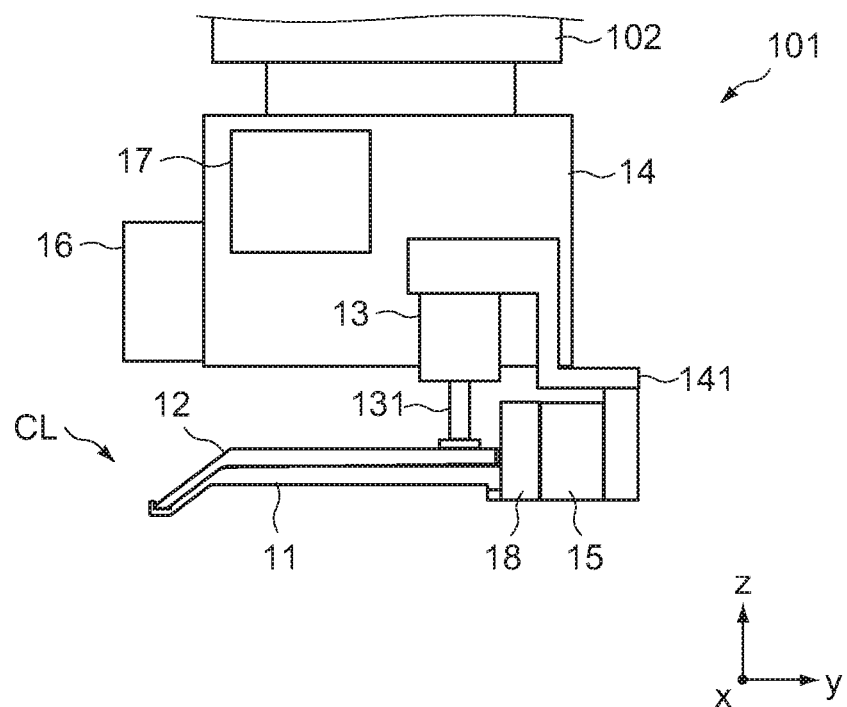
FIG. 2 is a schematic front view showing a configuration of a hand unit in the robot apparatus.

FIG. 2 is a schematic front view showing a configuration of the hand unit 101.

In the figure, an x-axis, a y-axis, and a z-axis indicate three axis directions orthogonal to each other.

The hand unit 101 includes a clamp mechanism CL capable of holding (gripping) a cable member F in the z-axis direction. The hand unit 101 further includes a base block 14, a force sensor 15, a camera 16, an illuminator 17, and the like.

Figure 8:
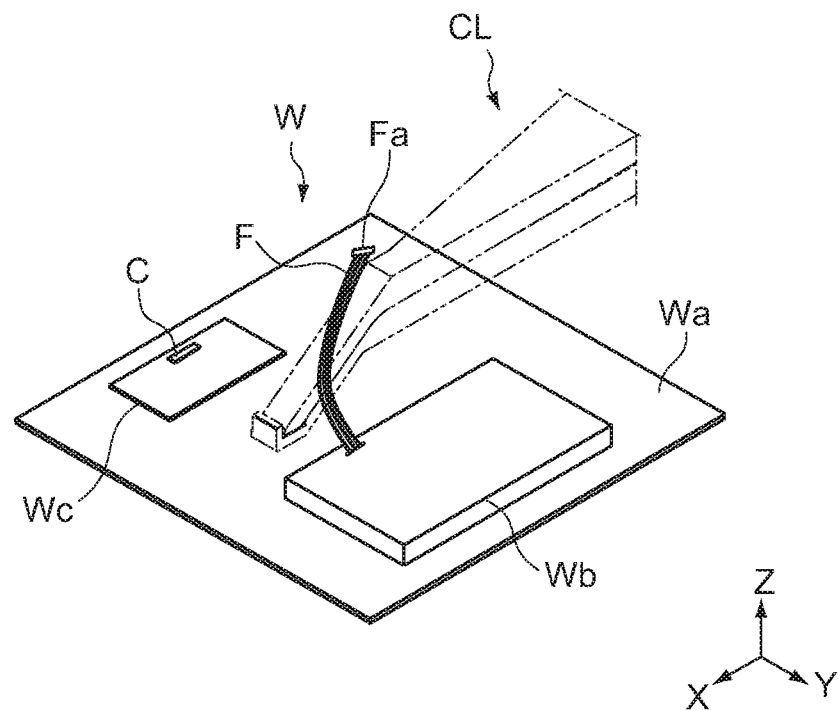
FIG. 8 is a schematic perspective view describing the method of producing an electronic apparatus according to an embodiment of the present technology.

The cable member F includes, for example, a wire group including a plurality of (3 in this example) wires such as a harness. As shown in FIG. 8, one end of the cable member F is fixed to an electronic part Wb fixed to a casing Wa as a base substrate of the workpiece W placed on the work bench 2 (stationary portion), and the other end (terminal unit Fa) thereof is disposed apart from the casing Wa in the unconnected state. In the terminal unit Fa, a plurality of terminal unit (e.g., three pins) is arranged at a predetermined pitch in the width direction.

The base block 14 supports the clamp mechanism CL, the camera 16 (imaging unit), the illuminator 17, and the like.

The camera 16 is configured to be capable of imaging the cable member F held by the clamp mechanism CL. The image signal acquired by the camera 16 is output to the controller 3.

The illuminator 17 is a light source for illuminating the clamp mechanism CL and the vicinity thereof at the time of imaging by the camera 16, and may be installed at a plurality of places as necessary.

The force sensor 15 is provided between a first finger 11 of the clamp mechanism CL and a bracket portion 141 of the base block 14, and is configured to be capable of detecting an external force acting on the clamp mechanism CL and a reaction force of the grip force on the cable member F. The detection signal of the force sensor 15 is output to the controller 3.

The clamp mechanism CL includes the first finger 11, a second finger 12, and a drive unit 13 that supports the second finger 12 in such a way that the second finger 12 is movable relative to the first finger 11 in one-axis direction (z-axis direction).

The first finger 11 is a plate-like member elongated in the y-axis direction, and one end (proximal end) thereof is supported by the force sensor 15 via a support portion 18. The second finger 12 is a plate-like member elongated in the y-axis direction similarly, and one end (proximal end) thereof is connected to a rod portion 131 of the drive unit 13. The drive unit 13 includes a linear motion unit such as an air cylinder, and is supported by the base block 14 via the bracket portion 141.

Figure 3:
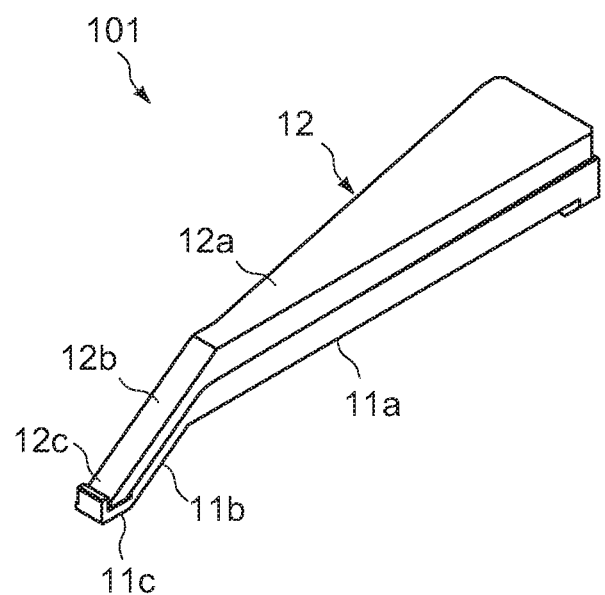
FIG. 3 is a perspective view showing first and second fingers in the hand unit.
Figure 4:
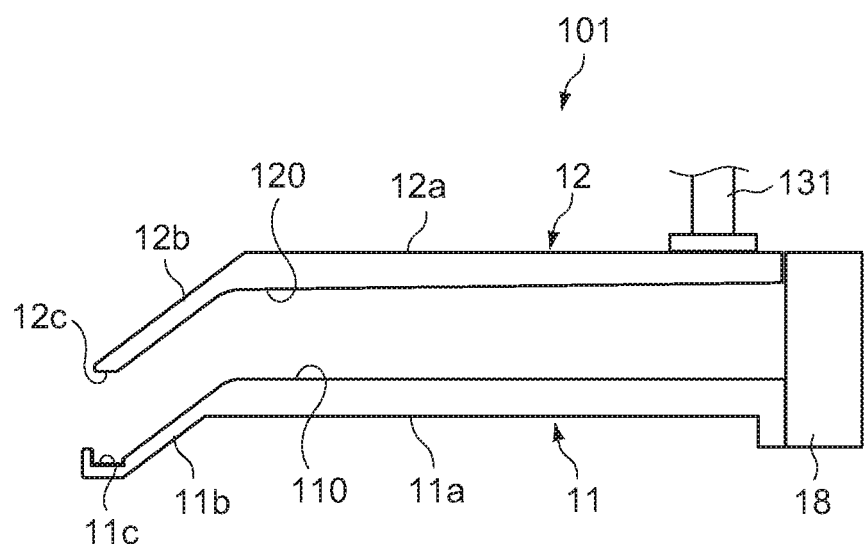
FIG. 4 is a front view showing the first and second fingers.
Figure 5:
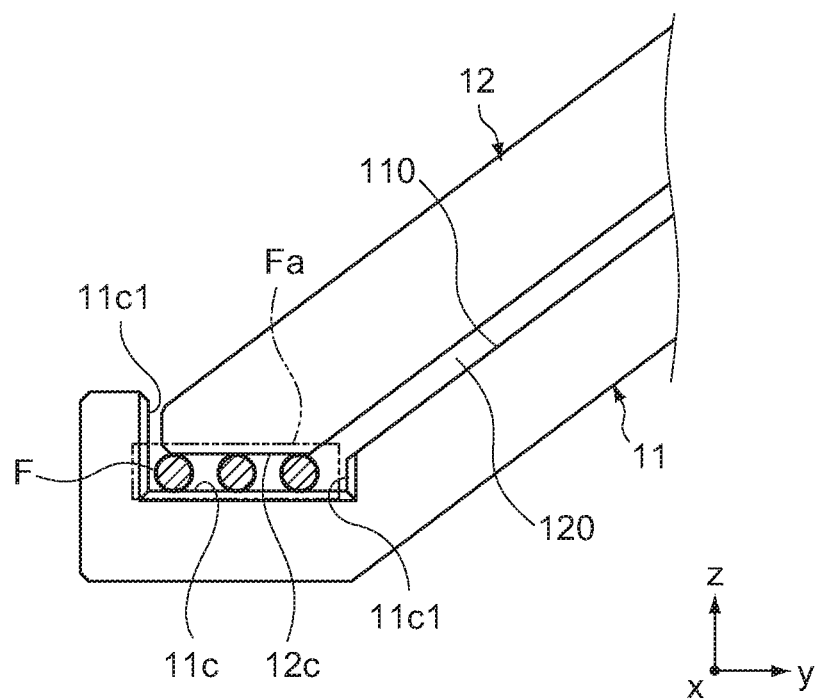
FIG. 5 is an enlarged view of a main portion of the tip of the first and second fingers.

FIG. 3 and FIG. 4 are respectively a perspective view and a front view showing the first and second fingers 11 and 12, and FIG. 5 is an enlarged view of a main portion of the tip of the first and second fingers 11 and 12.

The first and second fingers 11 and 12 are each formed of a metal material, and are each formed wider at one end (proximal end) than at the other end (tip) to secure the rigidity. However, it goes without saying that the shape thereof is not limited thereto. The first and second fingers 11 and 12 face each other in the z-axis direction, and the first finger 11 is located below the second finger 12. The second finger 12 is configured to be movable relative to the first finger 11 by the drive unit 13 between the position where they are adjacent to each other as shown in FIG. 2 and FIG. 3 and the position where they are separated from each other as shown in FIG. 4.

The first and second fingers 11 and 12 respectively include first flat plate portions 11a and 12a each extending from the proximal end in the y-axis direction, and second flat plate portions 11b and 12b bent at a predetermined angle from the first and second flat plate portions 11a and 12a toward the tip. That is, the tip of each of the first and second fingers 11 and 12 is formed by an inclined surface bent at a predetermined angle in the oblique direction.

The inner surface (surface facing the second finger 12) of the first and second flat plate portions 11a and 11b of the first finger 11 forms a first support surface 110 capable of supporting a plurality of wires of the cable member F from one side while the plurality of wires are aligned. The inner surface (surface facing the first finger 11) of the first and second flat plate portions 12a and 12b of the second finger 12 form a second support surface 120 capable of supporting the plurality of wires of the cable member F from the other side while the plurality of wires are aligned.

Here, "aligned" does not necessarily need to be parallel, and represents the state in which the respective wires are arranged in the same plane without overlapping with each other. The arrangement interval of each wire does not necessarily need to be constant, and some wires may be in contact with each other in the alignment direction.

At the tip of the first finger 11, a housing portion 11c connected to the first support surface 110 is provided. As shown in FIG. 5, the housing portion 11c is formed by a recess including a pair of guide walls 11c1 facing each other in the y-axis direction and a bottom portion parallel to the xy plane. The distance between the pair of guide walls 11c1 is equal to or larger than the width dimension of the cable member F in the alignment direction, and regulates the amount of movement of the cable member F housed in the housing portion 11c in the alignment direction (in the y-axis direction).

Meanwhile, at the tip of the second finger 12, a facing portion 12c facing the housing portion 11c is provided. As shown in FIG. 5, the facing portion 12c is formed by a plane parallel to the xy plane, and is configured to be capable of gripping the cable member F between the facing portion 12c and the housing portion 11c.

[Controller]

Figure 6:
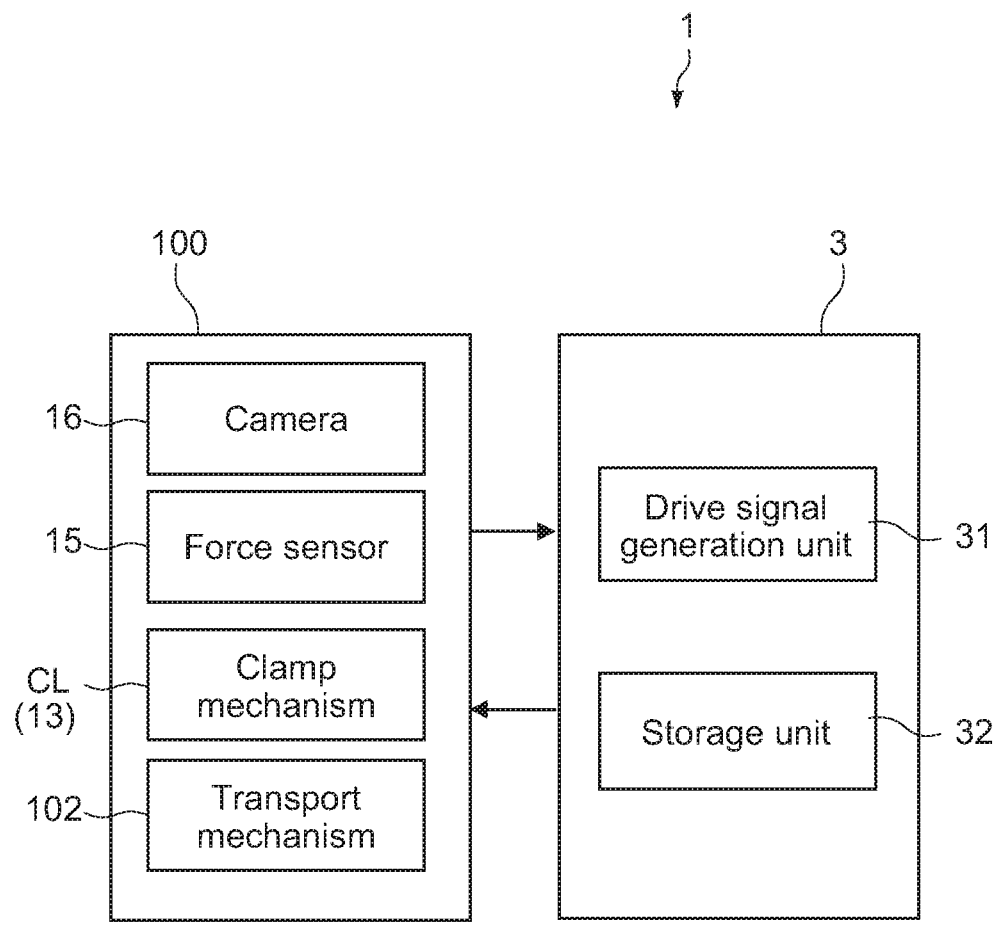
FIG. 6 is a functional block diagram of the robot apparatus.

FIG. 6 is a functional block diagram of the robot apparatus 1 including the controller 3.

The controller 3 typically includes a computer including a CPU (Central Processing Unit) and a memory. The controller 3 is configured to execute the program stored in the memory to control the operation of the respective units of the assembly robot 100.

The controller 3 includes a drive signal generation unit 31 and a storage unit 32. The controller 3 controls the grip force of the clamp mechanism CL for gripping the cable member F, and the movement direction of the clamp mechanism CL by the articulated arm 102.

The drive signal generation unit 31 acquires a detection signal and an image signal from the force sensor 15 and the camera 16 of the assembly robot 100 (hand unit 101), generates, on the basis of the detection signal and the image signal, control signals for controlling driving of the clamp mechanism CL and the transport mechanism (articulated arm 102), and outputs them to the robot apparatus 1.

For example, the drive signal generation unit 31 controls the distance between the first and second fingers 11 and 12 for the drive unit 13 of the clamp mechanism CL. On the basis of the output from the drive signal generation unit 31, the drive unit 13 opens the first and second fingers 11 and 12 to the opening degree necessary for clamping the cable member F, adjusts the grip force so that the cable member F is slidable in the in-plane direction between the first and second fingers 11 and 12, or increases the grip force on the cable member F so that the cable member F does not slide.

Further, the drive signal generation unit 31 controls the movement direction and the movement distance of the clamp mechanism CL for the articulated arm 102 (transport mechanism). On the basis of the output from the drive signal generation unit 31, the articulated arm 102 relatively moves the clamp mechanism CL relative to the workpiece W (casing Wa) on the work bench 2, and sequentially executes the raising/lowering operation of the cable member F at the pickup position, the guiding operation of the terminal unit Fa to the housing portion 11c, the posture conversion operation of the terminal unit Fa to a connector part C, and the like.

The storage unit 32 typically includes a semiconductor memory or the like. The storage unit 32 is configured to be capable of storing parameters necessary for calculation in the respective units, the image signal of the camera 16, the detection signal of the force sensor 15, and the like in addition to the program for controlling the operation of the respective units of the assembly robot 100, which includes a program for executing the function of the drive signal generation unit 31.

[Method of Producing Electronic Apparatus]

Subsequently, details of the controller 3 will be described together with a typical operation example of the robot apparatus 1.

Figure 7:
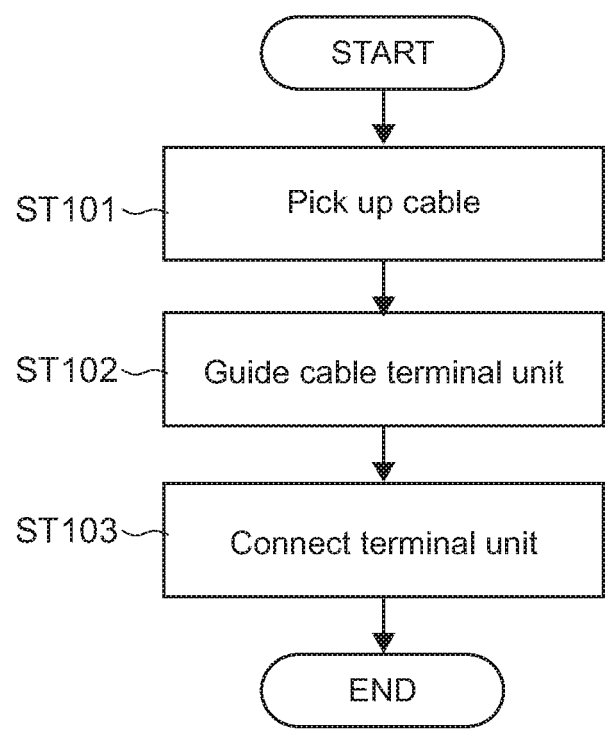
FIG. 7 is a flowchart showing an example of the operation of the robot apparatus.

FIG. 7 is a flowchart showing an example of the processing procedure executed by the controller 3, which includes an operation command for the assembly robot 100.

A method of producing an electronic apparatus according to this embodiment includes a step of picking up the cable member F (Step 101), a step of guiding the terminal unit Fa by the hand unit 101 (Step 102), and a step of connecting the terminal unit Fa to the connector part C (Step 103).

FIG. 8 to FIG. 11 are each a schematic perspective view of the workpiece W, which describes a method of connecting the cable member F. In each figure, an X-axis, a Y-axis, and a Z-axis indicate three axis directions orthogonal to each other, and the Z-axis corresponds to the height direction.

Here, the workpiece W is a semi-finished product of the electronic apparatus, and includes the casing Wa, the electronic part Wb, the connector part C, the cable member F, and the like.

Examples of the casing Wa include a part of a case of the electronic apparatus and a plate-like support disposed in the case. The electronic part Wb is, for example, a case fan. The electronic part Wb may include a circuit substrate in which various electronic parts are mounted on a printed wiring board, an electronic unit that incorporates a computer including a CPU, a memory, and the like, which constitutes one function of the electronic apparatus, or the like.

The connector part C (connection portion) constitutes an interface of various electronic parts, and is connected to the terminal unit Fa of the cable member F by the robot apparatus 1. The connector C is mounted on a printed wiring board We together with various electronic parts, a CPU, a memory, and the like. In this embodiment, the connector part C is provided with a connection port on the upper surface thereof. However, the present technology is not limited thereto, and a connection port may be provided toward the side surface.

The cable member F is a wire group having flexibility, such as a harness, as described above. One end of the cable member F is fixed to the electronic part Wb, and the other end (terminal unit Fa) is disposed at an arbitrary position on the casing Wa.

(Pickup Step)

In this step, the assembly robot 100 is moved to directly above the cable member F, and the cable member F is picked up by the raising/lowering operation and the opening/closing operation of the clamp mechanism CL.

For searching for the cable member F on the workpiece W, an image of the cable member F on the workpiece W acquired by the camera 16 may be used. The pickup position of the cable member F is not particularly limited, and an easy-to-pick-up area (e.g., an area that bends upward) may be selected.

For example, as shown in FIG. 8, in the case where one end of the cable member F is connected to the upper surface of the electronic part Wb and the other end extends upward, the clamp mechanism CL moves the area between the electronic part Wb and the connector part C in the X-axis direction, thereby making it possible to easily pick up the cable member F.

In the pickup step, the clamp mechanism CL clamps the cable member F so that the wires are aligned without overlapping with each other between the first and second fingers 11 and 12 from the open state shown in FIG. 4. One surface (lower surface in FIG. 8) of the cable member F is supported by the support surface 110 of the first finger 11, and the other surface (upper surface in the figure) is supported by the support surface 120 of the second finger 12.

At this time, the distance between the support surface 110 and the support surface 120 is set to a value slightly larger than the diameter of the each wire of the cable member F (first clamp state), and thus, the cable member F is made slidable relative to the fingers 11 and 12 in the in-plane direction. The position of the cable member F between the fingers 11 and 12 is not particularly limited, and may be between the first flat plate portions 11a and 12a or between the second flat plate portions 11b and 12b.

(Step of Guiding Cable Terminal Unit)

Subsequently, the controller 3 controls driving of the articulated arm 102 so that the clamp mechanism CL is moved in the direction in which the cable member F slides toward the housing portion 11c between the fingers 11 and 12.

Figure 9:
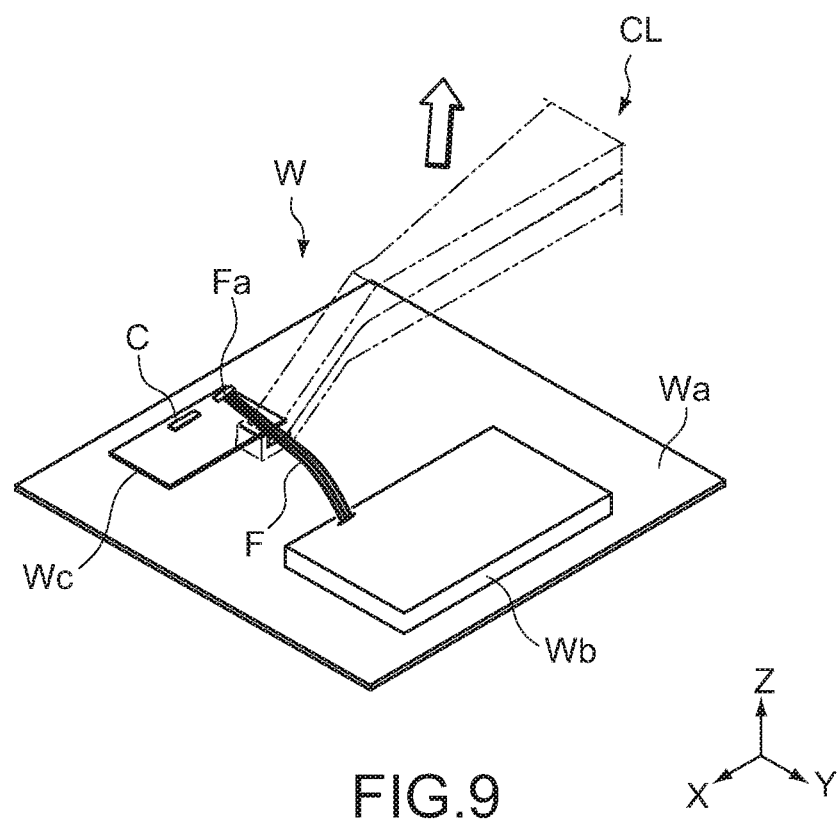
FIG. 9 is a schematic perspective view describing the method of producing an electronic apparatus according to the embodiment of the present technology.

In this step, assuming that the arrow direction of the Y-axis is the front in FIG. 9, the clamp mechanism CL is moved upward toward the left rear. As a result, the cable member F is relatively moved toward the housing portion 11c. The movement direction of the clamp mechanism CL is not limited thereto as long as it is a direction in which the cable member F can be guided toward the housing portion 11c (tip of the first finger 11).

The cable member F guided to the housing portion 11c is clamped between the pair of guide walls 11c1 as shown in FIG. 5, and thus, the movement of each wire in the alignment direction (y-axis direction in FIG. 5) is regulated. When the cable member F reaches the housing portion 11c, the slide of the cable member F with respect to the fingers 11 and 12 is regulated. Thus, the stress applied to the cable member F increases, and the value thereof is detected by the force sensor 15. The controller 3 considers, in the case of detecting that the output of the force sensor 15 has become equal to or larger than a predetermined value, that the cable member F has reached the housing portion 11c, and stops the movement of the clamp mechanism CL.

At this time, in order to prevent the cable member F that has reached the housing portion 11c from returning to the side of the support surface 110, the second finger 12 may be brought close to the first finger 11 to further reduce the distance between the support surfaces 110 and 120.

Next, the controller 3 controls driving of the articulated arm 102 so that the clamp mechanism CL is moved toward the terminal unit Fa while regulating the amount of movement of the cable member F in the above-mentioned alignment direction by the guide wall portions 11c1 in the housing portion 11c (second movement control).

Figure 10:
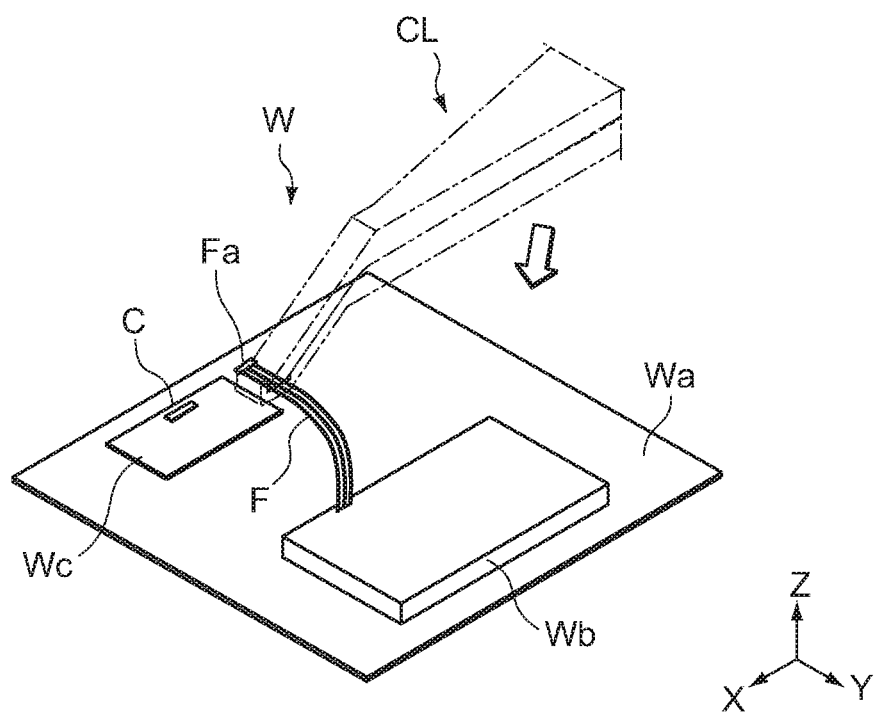
FIG. 10 is a schematic perspective view describing the method of producing an electronic apparatus according to the embodiment of the present technology.

In this step, assuming that the arrow direction of the Y-axis in FIG. 10 is the front, the clamp mechanism CL is moved upward to the right front toward the upper side of one end (fixed end) of the cable member F. As a result, the cable member F is relatively moved relative to the housing portion 11c in the length direction, and the terminal unit Fa is guided toward the housing portion 11c. The movement direction of the clamp mechanism CL is not limited thereto as long as it is a direction in which the terminal unit Fa can be guided toward the housing portion 11c.

Subsequently, the controller 3 controls driving of the clamp mechanism CL so that the first and second fingers 11 and 12 grip the terminal unit Fa or the vicinity thereof.

For the detection of the terminal unit Fa, an image acquired by the camera 16 of the hand unit 101 can be used. Further, in the case where the thickness of the terminal unit Fa is larger than the diameter of each wire of the cable member F, the terminal unit Fa cannot enter the housing portion 11c. In such a case, the contact between the terminal unit Fa and the outer surface of the housing portion 11c can be detected by the force sensor 15. After detecting that the terminal unit Fa or the vicinity thereof has reached the housing portion 11c, the controller 3 stops the movement of the clamp mechanism CL, and presses the facing portion 12c of the second finger 12 toward the cable member F in the housing portion 11c by a predetermined pressure to grip the cable member F (second clamp state).

(Step of Connecting Terminal Unit)

Figure 11:
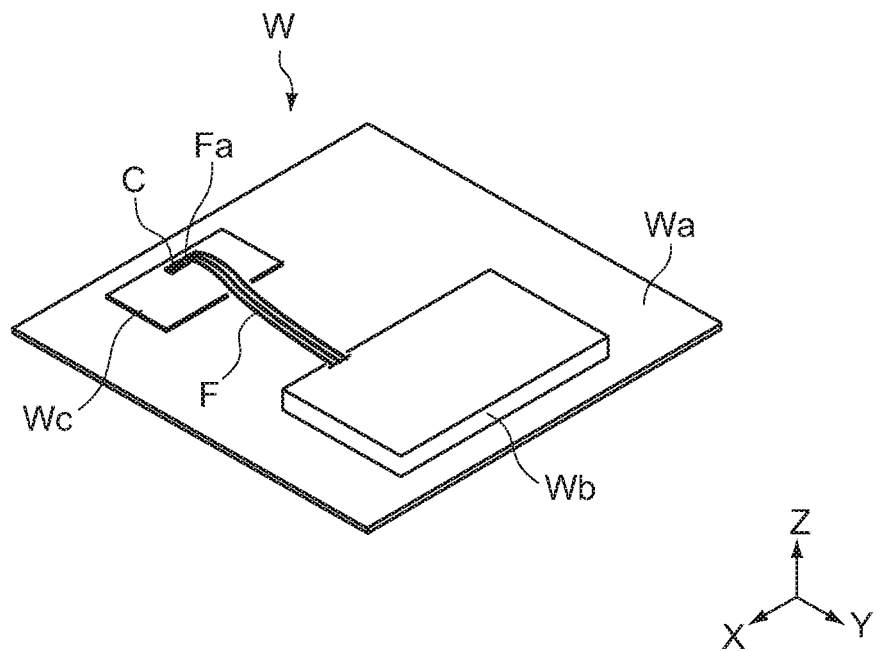
FIG. 11 is a schematic perspective view describing the method of producing an electronic apparatus according to the embodiment of the present technology.

Subsequently, the controller 3 controls driving of the articulated arm 102 so that the terminal unit Fa is connected to the connector part C by moving the clamp mechanism CL to the connector part C (connection portion) (see FIG. 11).

In this embodiment, since the connector part C is mounted on the casing Wa with the connection port directed upward, the articulated arm 102 causes the terminal unit Fa to be directed downward by rotating the hand unit 101 around the X-axis by 90°, and then, connects the terminal unit Fa to the connector part C.

At this time, the controller 3 may determine, on the basis of the image signal acquired by the camera 16, whether or not the orientation of the terminal unit Fa gripped by the clamp mechanism CL is in a predetermined posture. Further, whether or not the relative positional relationship between the terminal unit Fa and the connector part C is good or bad may be determined using a camera (second camera) installed at a place different from that of the hand unit 101.

As described above, in this embodiment, arbitrary portions of the cable member F are clamped by the first and second support surfaces 110 and 120, and the cable member is guided to the housing portion 11c while moving the clamp mechanism CL in the state in which the grip force is adjusted so that the cable member is slidable relative to the support surfaces 110 and 120. Since the guide walls 11c1 are provided in the housing portion 11c, the movement of each wire of the cable member F guided to the housing portion 11c in the alignment direction is regulated. In this state, the clamp mechanism CL is moved toward the terminal unit Fa of the cable member F. As a result, it is possible to grip the terminal unit Fa of the cable member F with high accuracy.

Further, in accordance with this embodiment, since the hand unit 101 includes the force sensor 15, it is possible to detect the arrival of the cable member F to the housing portion 11c with high accuracy. As a result, it is possible to prevent an excessive load from being applied to the cable member, and prevent the cable member F from being deformed and disconnected.

Further, it is possible to detect the grip force on the cable member F, the connection pressure of the terminal unit Fa to the connector part C, and the like with high accuracy by using the output of the force sensor 15, and carry out production of an electronic apparatus by the robot apparatus 1 smoothly and stably.

<Modified Example>

For example, in the above-mentioned embodiment, the workpiece W in which the terminal unit Fa of the cable member F is placed on the upper surface of the casing Wa has been described as an example. However, the aspect of the cable member F is not limited thereto. For example, the cable member F may protrude to the outside of the casing Wa. Similarly, the position and the orientation of the connection port of the connector part C can be changed as appropriate depending on the type of the workpiece and the like.

Further, in the above-mentioned embodiment, the housing portion 11c in the clamp mechanism CL is provided at the tip of the first finger 11. However, the present technology is not limited thereto. For example, the housing portion 11c may be provided at the center position of the first finger 11. In this case, it is possible to arbitrarily set the movement direction of the clamp mechanism CL in accordance with the initial position of the cable member F immediately after the pickup.

It should be noted that the present technology may take the following configurations.

(1) A robot apparatus, including:
  a clamp mechanism that includes
    a first finger and
    a second finger, the first finger having a first support surface and a housing portion, the first support surface being capable of supporting a wire group while the wire group is aligned, the wire group including a plurality of wires, one end of the wire group being fixed, the other end of the wire group including a terminal unit connectable to a connection portion, the housing portion including a guide wall that is connected to the first support surface and regulates an amount of movement of the wire group in an alignment direction,
    the second finger having a second support surface and a facing portion, the second support surface facing the first support surface, the facing portion being connected to the second support surface and facing the housing portion, the second finger being configured to be movable relative to the first finger;
  a transport mechanism capable of moving the clamp mechanism; and
  a control unit that controls a grip force of the clamp mechanism for gripping the wire group and a direction of movement of the clamp mechanism by the transport mechanism.

(2) The robot apparatus according to (1) above, in which the clamp mechanism further includes
  a drive unit capable of relatively moving the second finger relative to the first finger, and
  a force sensor capable of detecting an external force acting on the first finger.

(3) The robot apparatus according to (1) or (2) above, in which
  the control unit executes first movement control for moving the clamp mechanism in a direction in which the wire group slides toward the housing portion between the first support surface and the second support surface.

(4) The robot apparatus according to (3) above, in which
  the control unit executes second movement control for moving the clamp mechanism toward an upper side of the one end after the first movement control.

(5) The robot apparatus according to any one of (1) to (4) above, in which
  the housing portion is provided at a tip of the first finger.

(6) The robot apparatus according to any one of (1) to (5) above, further including
  a camera capable of imaging the wire group in the housing portion.

(7) A method of producing an electronic apparatus that includes a base substrate and a wire group, the base substrate including a connection portion, the wire group including a plurality of wires, one end of the wire group being fixed to the base substrate, the other end of the wire group including a terminal unit to be connected to the connection portion, the method including:
  clamping the wire group between first and second fingers of a clamp mechanism;
  moving the clamp mechanism in a direction in which the wire group aligned between the first and second fingers slides toward the housing portion;
  moving the clamp mechanism toward the terminal unit while regulating an amount of movement of the wire group in an alignment direction by a guide wall portion in the housing portion; and
  gripping the terminal unit or a vicinity thereof by the first and second fingers.

(8) The method of producing an electronic apparatus according to (8) above, further including
  connecting the terminal unit to the connection portion by moving the clamp mechanism to the connection portion.

(9) The method of producing an electronic apparatus according to (7) or (8) above, in which
  the wire group is a harness, an FPC (flexible printed circuit), or an FFC (flexible flat cable).

REFERENCE SIGNS LIST

1 robot apparatus
3 controller
11 first finger
11c housing portion
11c1 guide wall unit
12 second finger 12c facing portion
15 force sensor
16 camera
100 assembly robot
101 hand unit
102 articulated arm
110 first support surface
120 second support surface
C connector part
CL clamp mechanism
F cable member
Fa terminal unit
W workpiece

What is claimed is:

1. A robot apparatus, comprising:
a clamp mechanism that includes
   a first finger and
   a second finger, the first finger having a first support surface and a housing portion, the first support surface being capable of supporting a wire group while the wire group is aligned, the wire group including a plurality of wires, one end of the wire group being fixed, the other end of the wire group including a terminal unit connectable to a connection portion, the housing portion including a guide wall that is connected to the first support surface and regulates an amount of movement of the wire group in an alignment direction,
   the second finger having a second support surface and a facing portion, the second support surface facing the first support surface, the facing portion being connected to the second support surface and facing the housing portion, the second finger being configured to be movable relative to the first finger;
a transport mechanism capable of moving the clamp mechanism; and
a control unit that controls a grip force of the clamp mechanism for gripping the wire group and a direction of movement of the clamp mechanism by the transport mechanism.

2. The robot apparatus according to claim 1, wherein the clamp mechanism further includes
   a drive unit capable of relatively moving the second finger relative to the first finger, and
   a force sensor capable of detecting an external force acting on the first finger.

3. The robot apparatus according to claim 1, wherein the control unit executes first movement control for moving the clamp mechanism in a direction in which the wire group slides toward the housing portion between the first support surface and the second support surface.

4. The robot apparatus according to claim 3, wherein the control unit executes second movement control for moving the clamp mechanism toward an upper side of the one end after the first movement control.

5. The robot apparatus according to claim 1, wherein the housing portion is provided at a tip of the first finger.

6. The robot apparatus according to claim 1, further comprising
   a camera capable of imaging the wire group in the housing portion.

* * * * *